US006326841B1

(12) United States Patent
Laureanti

(10) Patent No.: US 6,326,841 B1
(45) Date of Patent: Dec. 4, 2001

(54) METHOD AND APPARATUS FOR COMPENSATING FOR LOSS OR RF OUTPUT POWER FROM THE ISOLATION PORT OF A HYBRID COUPLER

(75) Inventor: Steven J. Laureanti, Lewisville, TX (US)

(73) Assignee: Nokia Telecommunications, Oy, Espoo (FI)

( * ) Notice: Subject to any disclaimer, the term of this patent is extended or adjusted under 35 U.S.C. 154(b) by 0 days.

(21) Appl. No.: 09/293,082

(22) Filed: Apr. 16, 1999

(51) Int. Cl.[7] .................... H03F 3/60; H03F 3/68

(52) U.S. Cl. .................... 330/53; 330/84

(58) Field of Search .................... 330/53, 84, 107, 330/109, 124 R; 333/109

(56) References Cited

U.S. PATENT DOCUMENTS 4,656,434 4/1987 Selin .................... 330/84
5,101,171 * 3/1992 Redmond .................... 330/124 R
5,157,346 10/1992 Powell et al. .................... 330/151
5,287,069 * 2/1994 Okubo et al. .................... 330/84 X
5,423,081 6/1995 Thiele et al. .................... 455/116
5,903,189 * 5/1999 Huijser .................... 330/84 X

FOREIGN PATENT DOCUMENTS

6120750 * 4/1984 (JP) .................... 330/84

* cited by examiner

*Primary Examiner*—Steven J. Mottola
(74) *Attorney, Agent, or Firm*—Altera Law Group, LLC

(57) ABSTRACT

A power amplifier system for amplifying RF signals includes an RF signal feedback arrangement to compensate for the loss of RF output power from isolation ports of hybrid couplers in the system and reduces heat dissipated at the terminations, e.g., a resistor, or other components of the isolation ports of the hybrid couplers. The amplitude of the signals, which is not realized at either of the output ports of the power divider (one of the hybrid coupler) and/or either of the output ports of the power combiner (one of the hybrid coupler) at the termination of the isolation ports of the hybrid couplers, is fed back into the power amplifier system.

14 Claims, 2 Drawing Sheets

METHOD AND APPARATUS FOR COMPENSATING FOR LOSS OR RF OUTPUT POWER FROM THE ISOLATION PORT OF A HYBRID COUPLER

BACKGROUND OF THE INVENTION

1. Field of the Invention

This invention relates in general to power amplifiers, and more particularly, to a method and apparatus for compensating for loss of RF output power from the isolation port of a hybrid coupler.

2. Description of Related Art

To meet the increasing RF output power requirements of a cellular base station or other communication systems, it has become a necessity to utilize a parallel amplifier configuration for a final power amplifier stage of a transmitter unit in the communication system. The utilization of a parallel amplifier configuration causes a problem for the transmitter unit in the form of heat dissipation and RF power loss at the output of the RF power coupler, e.g. a power divider, or a power combiner. A block diagram of a parallel amplifier configuration in a typical power amplifier system can be seen in FIG. 1.

In FIG. 1, an input signal from previous stages of a transmitter unit in a communication system, such as a cellular base station, is injected into a first coupler, namely an input signal coupler. A portion of the input signals is coupled and sent to a power control circuitry which monitors and adjusts the input signal for an appropriate signal level. From the first coupler, the signal enters a first hybrid coupler, used as a power divider, whereby the signal is divided. The divided signals vary in amplitude and phase depending on a mismatch presented at the termination of an isolation port of the first hybrid coupler and on the impedance variation presented by the power amplifiers in parallel. The amplitude of the signal that is not realized at either of the output ports of the power divider is realized at the termination of the isolation port of the first hybrid coupler and is dissipated as heat into the resistor present from the first hybrid coupler to the ground, thereby causing power loss at the output ports of the RF power divider. The divided signals that are realized at the output ports of the power divider are amplified by the respective power amplifiers and are presented to a second hybrid coupler, used as a power combiner. The signals are combined, and the resultant signal varies in amplitude and phase depending on the mismatch presented at the termination of the isolation port of the second hybrid coupler and on the impedance variation presented by the power amplifiers. The amplitude of the signal that is not realized at the output port of the power combiner is realized at the termination of the isolation port of the second hybrid coupler and is dissipated as heat into the resistor present from the second hybrid coupler to the ground, thereby causing power loss at the output port of the RF power combiner.

To solve the above problem, U.S. Pat. No. 4,656,434 proposed an RF power amplifier with load mismatch compensation. In the '434 patent, the RF power amplifier delivers power to a load including: a first quadrature hybrid coupler driving two class C amplifiers operating with high input compression; a second quadrature hybrid coupler coupled to the outputs of the amplifiers; an attenuator; and a phase shifter. An impedance mismatch by the load, causing phase-pulling of the amplifiers which reduces output to the load, is compensated for by feeding an error signal. The error signal indicates the magnitude and phase of the phase-pulling of the two amplifiers, from the second quadrature hybrid coupler through the attenuator and the phase shifter back to the first quadrature hybrid coupler. The attenuated and phase shifted error signal adds to or is subtracted from the input signals to the two amplifiers. Therefore, one of the two amplifiers is driven with more signal and the other amplifier is driven with less signal to phase-push the two amplifiers to compensate for the phase-pulling to thereby increase the output to the load.

The problem of the power amplifier system in the '434 patent is that the power control is accomplished by a feedback attenuator. The feedback attenuator basically takes the place of the termination at the isolation port of the second quadrature hybrid coupler and still dissipates the same approximate amount of heat. In addition, the feedback component in the '434 patent is an error signal. Thus, the RF power loss at the final power amplifier stage of the transmitter unit and the heat problem which would cause low reliability of the power amplifiers still exist. Further, the '434 patent does not resolve the power loss and heat dissipation problem of the first quadrature hybrid coupler. Furthermore, in the '434 patent, the fed back error signal drives one of the amplifiers harder than the other. Therefore, one of the harder amplifiers is forced to run at a higher operating junction temperature thereby having a lower MTTF (Mean Time To Failure).

Accordingly, it can be seen that there is a need for a power amplifier system that compensates for the loss of an RF output power. There is also a need for a power amplifier system that reduces heat dissipation at terminations, resistors, or other components of the system.

SUMMARY OF THE INVENTION

To overcome the limitations in the prior art described above, and to overcome other limitations that will become apparent upon reading and understanding the present specification, the present invention is a method and apparatus for compensating for loss of RF output power from the isolation port of a hybrid coupler.

The present invention solves the above-described problems by providing a power amplifier system that compensates for the loss of an RF output power from isolation ports of hybrid couplers at a final power amplifier stage of a transmitter unit. The power amplifier system of the present invention also reduces heat dissipation at the terminations, resistors, or other components of the isolation ports of the hybrid couplers.

A system in accordance with the principles of the present invention includes a first and a second amplifier and a feedback loop for feeding back an RF signal from the second amplifier stage to the first amplifier stage to reduce RF power dissipation.

Other embodiments of a system in accordance with the principles of the invention may include alternative or optional additional aspects. One such aspect of the present invention is that RF input signals of the system are adjusted based on the RF signals from the feedback to compensate for power loss in an RF output signal.

Another aspect of the present invention is that the system includes a first hybrid coupler for dividing the RF input signals and a second hybrid coupler for combining signals from the first and second amplifiers, the RF signal being fed back from the second amplifier stage to the first amplifier stage including a RF signal from the first hybrid coupler to reduce in RF power dissipated as heat at the first hybrid coupler.

Another aspect of the present invention is that the system includes a first hybrid coupler for dividing an RF input signal and providing the divided signal to the first and second amplifiers and a second hybrid coupler for combining signals from the first and second amplifiers, the RF signal being fed back from the second amplifier stage to the first amplifier stage including an RF signal from the second hybrid coupler to reduce RF power dissipated as heat at the second hybrid coupler.

Another aspect of the present invention is that the system includes a first hybrid coupler for dividing the RF input signals and a second hybrid coupler for combining amplified input signals, the RF signal being fed back from the second amplifier stage to the first amplifier stage including a first RF signal from the first hybrid coupler to allow for a reduction in RF power dissipated as heat at the first hybrid coupler and a second RF signal from the second hybrid coupler to allow for a reduction in RF power dissipated as heat at the second hybrid coupler.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the exemplary embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The present invention provides a method and apparatus for compensating for loss of RF output power from the isolation port of a hybrid coupler at a power amplifier stage of a transmitter unit. The power amplifier system of the present invention also reduces heat dissipation at the terminations, resistors, or other components of the isolation ports of the couplers.

Figure 1:
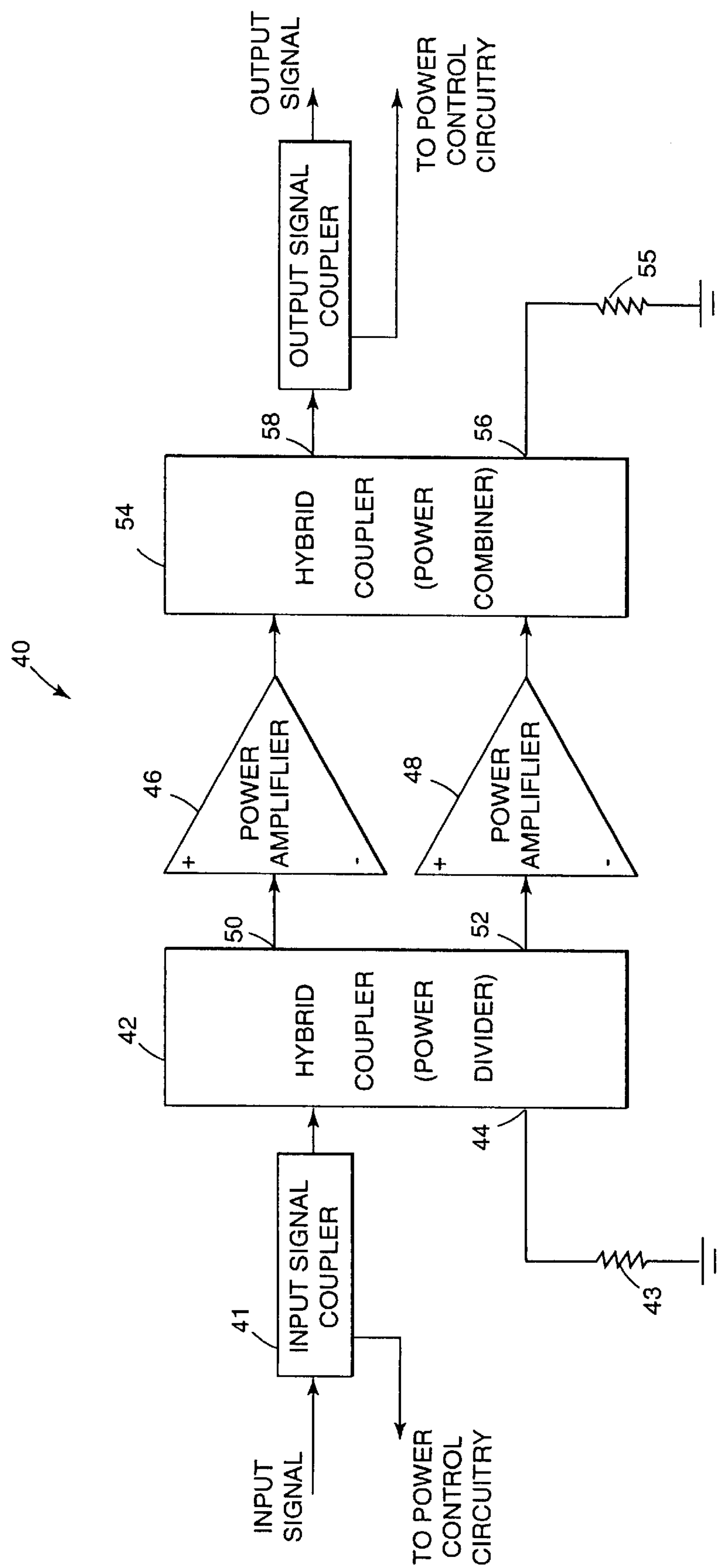
FIG. 1 illustrates a block diagram of a typical power amplifier system.

FIG. 1 illustrates a block diagram of a parallel amplifier configuration of a typical power amplifier system 40. An input signal from previous stages of a transmitter unit in a communication system, such as a cellular base station, is injected into an input signal coupler 41. A portion of the input signals is coupled and sent to a power control circuitry which monitors and adjusts the input signal for an appropriate signal level. It is appreciated that the power control circuitry is known by those skilled in the art. From the first coupler 41, the signal is sent to a first hybrid coupler 42. The first hybrid coupler 42 is used as a power divider, whereby the signal is divided. In FIG. 1, the coupler 42 is a one-to-two divider. It is appreciated that the coupler can have a different arrangement of inputs and outputs. The divided signals vary in amplitude and phase depending on a mismatch presented by the termination 43 at an isolation port 44 of the first hybrid coupler 42 and on the impedance variation presented by power amplifiers 46,48 in parallel. The amplitude of the signal that is not realized at either of the output ports 50,52 of the hybrid coupler 42 is realized at the termination of the isolation port 44 of the first hybrid coupler 42 and is dissipated as heat into the termination present from the hybrid coupler 42 to the ground, thereby causing power loss at the output ports 50,52 of the RF power divider 42. The divided signals that are realized at the output ports 50,52 of the power divider 42 are amplified by the power amplifiers 46,48, respectively, and are presented to a second hybrid coupler 54. The second hybrid coupler 54 is used as a power combiner. The signals from the power amplifiers 46,48 are combined in the second hybrid coupler 54. The combined signal varies in amplitude and phase depending on the mismatch presented by the termination 55 at the isolation port 56 of the second hybrid coupler 54 and on the impedance variation presented by the power amplifiers 46,48. The amplitude of the signal that is not realized at the output port 58 of the power combiner 54 is realized at the termination of the isolation port 56 of the second hybrid coupler 54 and is dissipated as heat into the termination present from the second hybrid coupler 54 to the ground, thereby causing power loss at the output port 58 of the RF power combiner 54.

Figure 2:
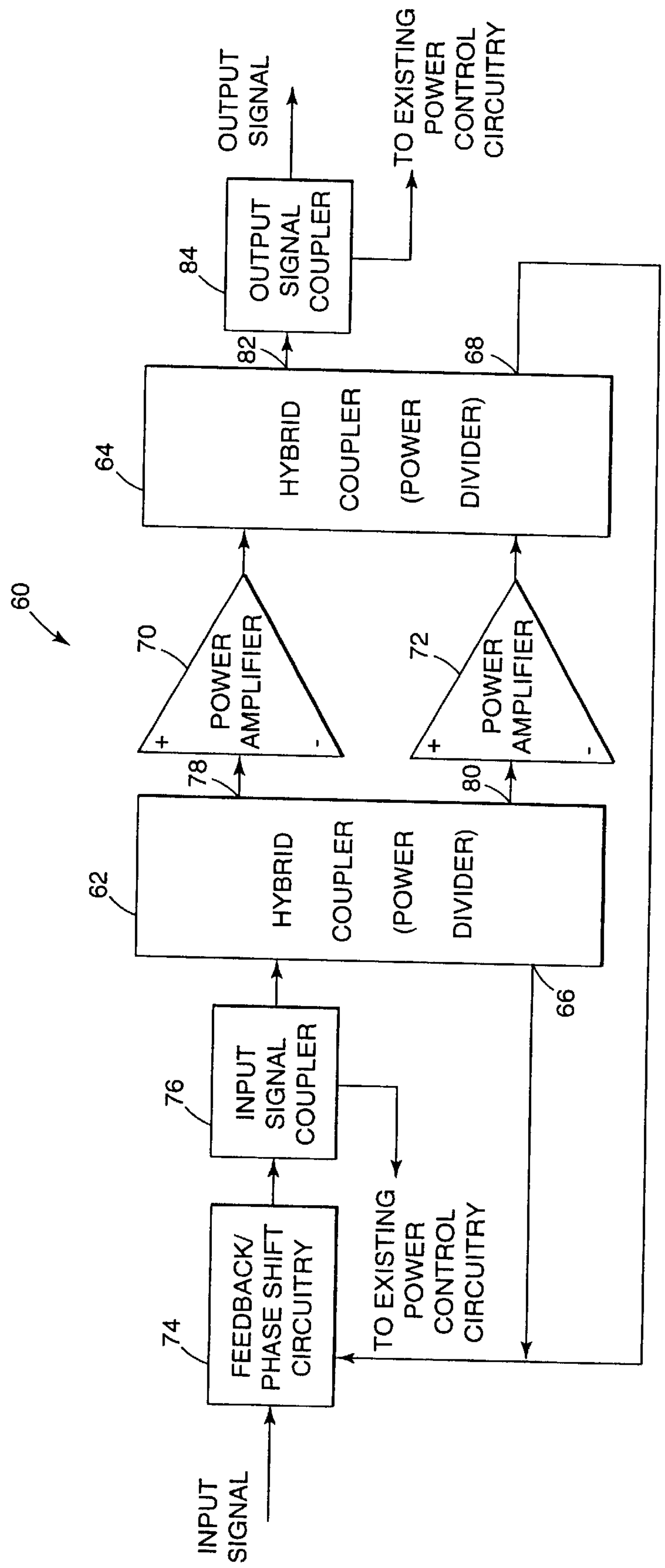
FIG. 2 illustrates a block diagram of a power amplifier system in accordance with the principles of the present invention.

FIG. 2 illustrates a block diagram of a parallel amplifier configuration of a power amplifier system 60 in accordance with the present invention. The system 60 compensates for the RF power loss of hybrid couplers 62,64 used as an RF power divider and an RF power combiner, respectively. The power amplifier system shown in FIG. 2 can be used in a cellular base station application. The input signal from the previous stages of the transmitter unit of the cellular base station is injected through a feedback/phase shifter circuitry 74. It is appreciated that the placement of the circuitry 74 can be at any point in the amplifier stages prior to the parallel amplifier configuration. FIG. 2 shows that the circuitry 74 is directly prior to an input signal coupler 76 for a clear, exemplary visual presentation. The signal is then injected into a first coupler, i.e. the input signal coupler 76.

A portion of the signal is coupled and sent to a power control circuitry. It is appreciated that the power control circuitry is known by those skilled in the art. The power control circuitry allows for active tracking of the feedback network and adjusts the input signal to the appropriate signal level to compensate for the RF power being fed back into the amplifier stages.

From the input signal coupler 76, the signal is sent to the hybrid coupler 62 which is used as a power divider. The divided signals vary in amplitude and phase depending on the mismatch presented at the termination of the isolation port 66 of the coupler 62 and on the impedance variation presented by the power amplifiers 70,72. The amplitude of the signal that is not realized at either of output ports 78,80 of the power divider 62 is realized at the isolation port 66 fed back into the system, here the feedback/phase shift circuitry 74.

The divided signals that are realized at the output ports 78,80 of the power divider 62 are amplified by the power amplifiers 70,72 and are presented to the hybrid coupler 64 used as a power combiner. The signals are combined, and the resultant signal vary in amplitude and phase depending on the mismatch presented at the termination of the isolation port 68 and on the impedance variation presented by the power amplifiers 70,72. The amplitude of the signal that is not realized at an output port 82 of the power combiner 64 is realized at the isolation port 68 and fed back into the system, here the feedback/phase shift circuitry 74. The combined signals that are realized at the output port 82 of the power combiner 64 are then sent to an output signal coupler 84. The output signal from the output signal coupler 84 can then be sent to the next stage.

A portion of the output signal is coupled and sent to the power control circuitry which monitors and adjusts the input signals. Again, it is appreciated that the power control circuitry is known by those skilled in the art. As stated above, the power control circuitry allows for active tracking of the feedback network and adjusts the input signal to the appropriate signal level.

By utilizing the isolation ports as a feedback path to the previous amplifier stages, the present invention allows for a reduction in RF power dissipated as heat into a termination, e.g., a resistor 43, as illustrated in FIG. 1, thereby allowing for a more efficient use of the RF power already generated by a communication system, such as a cellular base station.

One of the applications of the present invention is the power amplifier system of the cellular base station. By compensating for the impedance variation of the parallel amplifiers, the power amplifier system increases manufacturing yields. Further, by eliminating the excessive heat dissipated through the isolation port into a termination, e.g., resistor, the power amplifier system increases cellular base station reliability. Furthermore, by utilizing the power control circuitry of the amplifier stages to decrease the supplied RF power as the RF output power is being fed back, the power amplifier system decreases power consumption.

It is appreciated that the power control of the present invention can be accomplished via the current RF power detection in the transmitter (or transceiver) unit. This allows for active tracking of the feedback network and adjusts the input signal to the appropriate signal level to compensate for the RF power being fed back into the amplifier stages.

As shown in FIG. 2, it is the RF signal, not the error signal as used in the U.S. Pat. No. 4,656,434 patent, that is fed back. One of the advantages of feeding back the RF signal is that it does not drive either of the amplifiers any different from the design without the feedback, thus preventing one of the amplifiers from being forced to run at a higher operating junction temperature as presented in the '434 patent. Thus, the amplifiers have high and equally high reliability, i.e. high MTTF (Mean Time To Failure).

The power amplifiers 70,72 are preferably Class AB type power amplifiers. The Class AB type power amplifiers can be operated with low input compression. It is appreciated that other types of power amplifiers can be used within the scope of the invention.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A power amplifier system comprising;

a first amplifier;

a second amplifier;

a feedback loop for feeding back an RF signal from the second amplifier stage to the first amplifier stage through a hybrid coupler to reduce RF power dissipation, wherein RF input signals of the system are adjusted based on the RF signals from the feedback to compensate for power loss in an RF output signal; and a first hybrid coupler for dividing the RF input signals and a second hybrid coupler for combining signals from the first and second amplifiers, the RF signal being fed back from the second amplifier stage to the first amplifier stage including a RF signal from the first hybrid coupler to reduce RF power dissipated as heat at the first hybrid coupler.

2. A power amplifier system comprising:

a first amplifier;

a second amplifier;

a feedback loop for feeding back an RF signal from the second amplifier stage to the first amplifier stage through a hybrid coupler to reduce RF power dissipation, wherein RF input signals of the system are adjusted based on the RF signals from the feedback to compensate for power loss in an RF output signal; and a first hybrid coupler for dividing the RF input signals and a second hybrid coupler for combining amplified input signals, the RF signal being fed back from the second amplifier stage to the first amplifier stage including a first RF signal from the first hybrid coupler to allow for a reduction in RF power dissipated as heat at the first hybrid coupler and a second RF signal from the second hybrid coupler to allow for a reduction in RF power dissipated as heat at the second hybrid coupler.

3. A power amplifier system for amplifying RF input signals and generating RF output signals, comprising:

a first coupler;

a first hybrid coupler, connected to the first coupler, for dividing the RF input signals into a first set of RF signals, a second set of RF signals, and a third set of RF signals;

a first amplifier, connected to the first hybrid coupler, for amplifying the first set of RF signals;

a second amplifier, connected to the first hybrid coupler, for amplifying the second set of RF signals;

a second hybrid coupler, connected to both the first and second amplifiers, for combining amplified first and second sets of RF signals and generating a fourth set of RF signals and a fifth set of RF signals;

a second coupler, connected to the second hybrid coupler, for receiving the fourth set of RF signals and coupling the fourth set of RF signals to the RF output signals; and a feedback/phase shift circuitry, connected to the first coupler and the first and second hybrid couplers, for adjusting the RF input signals based on the third set of RF signals and the fifth set of RF signals to compensate for power loss of the RF output signals, and feeding the adjusted RF input signals to the first coupler.

4. The system of claim 3, further comprising a power control circuitry for monitoring and adjusting the RF input signals, wherein a portion of the adjusted RF input signals are sent to the power control circuitry.

5. The system of claim 3, further comprising a power control circuitry for monitoring and adjusting the RF input signals, wherein a portion of the fourth set of RF signals are sent to the power control circuitry.

6. The system of claim 4, wherein a portion of the fourth set of RF signals are sent to the power control circuitry.

7. A power amplifier system for amplifying RF input signals and generating RF output signals, comprising:

first coupling means for dividing the RF input signals into a first set of RF signals, a second set of RF signals, and a third set of RF signals;

first amplifier means, connected to the first coupling means, for amplifying the first set of RF signals;

second amplifier means, connected to the first coupling means, for amplifying the second set of RF signals;

second coupling means, connected to both the first and second amplifier means, for combining amplified first and second sets of RF signals and generating a fourth set of RF signals and a fifth set of RF signals, the fourth set of RF signals being coupled to be the RF output signals; and feedback/phase shift means, connected to the first and second coupling means, for adjusting the RF input signals based on the third set of RF signals and the fifth set of RF signals to compensate for power loss of the RF output signals.

8. The system of claim 7, further comprising power control means for monitoring and adjusting the RF input signals, wherein a portion of the adjus ted RF input signals are sent to the power control means.

9. The system of claim 7, further comprising power control means for monitoring and adjusting the RF input signals, wherein a portion of the fourth set of RF signals are sent to the power control means.

10. The system of claim 8, wherein a portion of the fourth set of RF signals are sent to the power control means.

11. A transmitter having a power amplifier system for amplifying input signals and generating output signals, comprising:

first coupling means for dividing the input signals into a first set of signals, a second set of signals, and a third set of signals;

first amplifier means, connected to the first coupling means, for amplifying the first set of signals;

second amplifier means, connected to the first coupling means, for amplifying the second set of signals;

second coupling means, connected to both the first and second amplifier means, for combining amplified first and second sets of signals and generating a fourth set of signals and a fifth set of signals, the fourth set of signals being coupled to be the output signals; and feedback/phase shift means, connected to the first and second coupling means, for adjusting the input signals based on the third set of signals and the fifth set of signals to compensate for power loss of the RF output signals.

12. The transmitter of claim 11, further comprising power control means for monitoring and adjusting the input signals, wherein a portion of the adjusted input signals are sent to the power control means.

13. The transmitter of claim 11, further comprising power control means for monitoring and adjusting the input signals, wherein a portion of the fourth set of signals are sent to the power control means.

14. The transmitter of claim 12, wherein a portion of the fourth set of signals are sent to the power control means.

* * * * *